United States Patent [19]

Sugibayashi

[11] Patent Number: 5,889,712
[45] Date of Patent: Mar. 30, 1999

[54] SEMICONDUCTOR MEMORY DEVICE

[75] Inventor: Tadahiko Sugibayashi, Tokyo, Japan

[73] Assignee: NEC Corporation, Japan

[21] Appl. No.: 27,348

[22] Filed: Feb. 20, 1998

[30]     Foreign Application Priority Data

Feb. 28, 1997   [JP]   Japan .................................. 9-046077

[51] Int. Cl.$^6$ .................................................. G11C 7/00
[52] U.S. Cl. ..................................... 365/200; 365/230.03
[58] Field of Search ................................. 365/200, 222, 365/230.03, 225.7; 371/10.2, 10.3

[56]           References Cited

U.S. PATENT DOCUMENTS

| | | | |
|---|---|---|---|
| 5,257,229 | 10/1993 | McClure et al. | 365/200 |
| 5,691,946 | 11/1997 | DeBrosse et al. | 365/200 |
| 5,761,138 | 1/1998 | Lee et al. | 365/200 |
| 5,798,973 | 8/1998 | Isa | 365/200 |
| 5,801,999 | 9/1998 | Satou et al. | 365/200 |

FOREIGN PATENT DOCUMENTS

| | | | |
|---|---|---|---|
| 785696 | 3/1995 | Japan | G11C 29/00 |
| 8102529 | 4/1996 | Japan | H01L 27/108 |

*Primary Examiner*—Son T. Dinh
*Attorney, Agent, or Firm*—Hayes, Soloway, Hennessey, Grossman & Hage, P.C.

[57]           ABSTRACT

A semiconductor memory device is disclosed, in which a memory region which can not be used due to existence of defective bit line is reduced. In a DRAM of a double word line system, when there is a defective bit line 103 in a certain block thereof, only a memory region 104 in a right or left portion of the block to which the defective bit line 103 belongs is made invalid and a region on the other side is made valid. In this case, clusters are constructed with the valid memory region by converting the uppermost bits of a row address and the uppermost bits of a column address by means of an address conversion circuit.

4 Claims, 9 Drawing Sheets

SEMICONDUCTOR MEMORY DEVICE

BACKGROUND OF THE INVENTION

1. Field of the Invention

The present invention relates to a semiconductor memory device which can inhibit to use the defective addresses.

2. Description of the Related Art

Recently, a memory capacity of a semiconductor memory device, particularly, a DRAM (Dynamic Random Access Memory), is substantially increased. However, the reduction of yield of the recent semiconductor memory device due to increase of the memory capacity becomes a problem. It is very difficult to fabricate perfect semiconductor memory devices and it has been known that many semiconductor memory devices fabricated contain defective cells and/or defective bit lines. In order to salvage such semiconductor memory devices containing defective cells and/or defective bit lines, a semiconductor memory device is generally provided with a redundancy mechanism. That is, a defective semiconductor memory including a defective memory cell or a memory cell which can not be used due to a defective bit line can be used as a substantially perfect semiconductor memory by replacing the defective memory cell or the memory cell including the defective bit line by a redundancy cell. With this scheme, the reduction of yield of the semiconductor memory device is improved.

However, due to the recent drastic increase of memory capacity, there are a considerable number of cases where the semiconductor memory device fabricated includes too many defective cells and/or defective bit lines to be salvaged by such redundancy mechanism. It is not preferable in view of yield to abandon all of such semiconductor memory devices as defective memory devices. In order to salvage such semiconductor memory devices and enable to ship them as perfect semiconductor memory devices, a semiconductor memory device whose defective address can be detected by an external device has been proposed in, for example, Japanese Patent Application Laid-open No. H8-102529.

FIG. 11 shows the proposed semiconductor memory device 1000 schematically. The semiconductor memory device 1000 is a DRAM of a double word-line system including main word lines and sub-word lines. The main word line is selected by a main word decoder 1001 which receives a portion of a row address and the sub-word line is selected by sub-word line decoders 1002 which receive the remaining row address.

In FIG. 11, hatched portions are a defective address, an access to which is impossible. That is, a memory cluster 1003 to which a defective cell 1004 which can not be salvaged by a redundancy mechanism belongs can not be accessed due to the presence of the defective cell 1004 and all of memory clusters to which a defective bit line 1006 which is not salvaged by the redundancy mechanism belongs, that is, one memory block 1005, can not be accessed due to the presence of the defective bit line 1006.

FIG. 12 shows a main word line drive circuit 1100 for driving respective main word line pairs MWL and MWLB contained in the main word decoder 1001, which is provided for every main word line. This main word line drive circuit 1100 is provided with a fuse 1101 as shown in FIG. 12. When this fuse 1101 is cut, all of word lines connected to the corresponding main word line pairs MWL and MWLB becomes invalid. It should be noted here that the term "invalidation" used here means not to make an access physically impossible but to merely inhibit an access thereto from an external device.

In FIG. 11, a situation is shown in which, in order to make the memory cluster to which the defective cell 1004 belongs invalid, a fuse 1007 corresponding to this memory cluster is cut and, in order to make all memory clusters (one memory block 1005) to which the defective bit line 1006 belongs, all fuses 1008 corresponding to these memory clusters are cut.

It can be read out externally of the semiconductor memory device 1000 by using a roll call test mode whether or not the fuse 1101 is cut. In the roll call test mode, it is detected by a switching of the level of the roll call signal RCX to low level whether or not the main word line is invalid.

Therefore, in order to detect a memory cluster, that is, a main word line, which is invalid, a user of the DRAM performs the roll call test immediately after a power source of the DRAM is turned on. When it is detected in this roll call test that a certain main word line is invalid, it means that a use of a memory cluster corresponding to the invalid main word line is impossible and the memory cluster is registered in a defective address table of another memory device externally of the semiconductor memory 1000 as a defective memory cluster.

According to this technique, a portion of the memory capacity of the semiconductor memory device 1000 is practically lost due to the presence of this memory cluster which can not be used. However, since the semiconductor memory device containing defectiveness which can not be salvaged by the redundancy mechanism can be shipped as an acceptable semiconductor memory, the yield is improved.

As another prior art semiconductor memory, Japanese Patent Application Laid-open No. H7-85696 discloses a technique in which a semiconductor memory device is divided to four memory blocks and, when there is no defective bit line, all of the four memory blocks are used and the semiconductor memory device is shipped as a DRAM having memory capacity of, for example, 64M bits and, when there is, for example, three of the four memory blocks having defective bit lines, the remaining memory block which has no defectiveness is used and the semiconductor memory device is shipped as a DRAM having a memory capacity which is one fourth of the original capacity, that is, 16M bits.

In the conventional semiconductor memory device 1000, however, when there is a defective bit line 1006, all memory clusters to which the defective bit line 1006 belongs, that is, one memory block becomes invalid. Therefore, a large number of memory cells can not be used due to an existence of defective bit line and the memory capacity of the semiconductor memory is substantially reduced.

SUMMARY OF THE INVENTION

An object of the present invention is to provide a semiconductor memory device having a minimum number of memory cells which are to be disconnected due to a defective bit line.

In order to achieve the object, the semiconductor memory device according to the present invention comprises a main word line, a first and second memory regions which are activated by the main word line, a circuit for producing a first signal indicative of a defectiveness of at least one of the first and second memory regions, a circuit for producing a second signal indicative of defectiveness of the first memory region, a circuit for producing a third signal indicative of defectiveness of the second memory region and a circuit for invalidating the first memory region when the first and second signals indicate defectiveness and invalidating the second memory region when the first and third signals indicate defectiveness. According to the semiconductor memory of the present invention, a memory region to be invalidated becomes a half of that of the conventional semiconductor memory device.

DETAILED DESCRIPTION OF THE PREFERRED EMBODIMENTS

A basic concept of the present invention will be described with reference to FIGS. 1 and 2.

Figure 1:
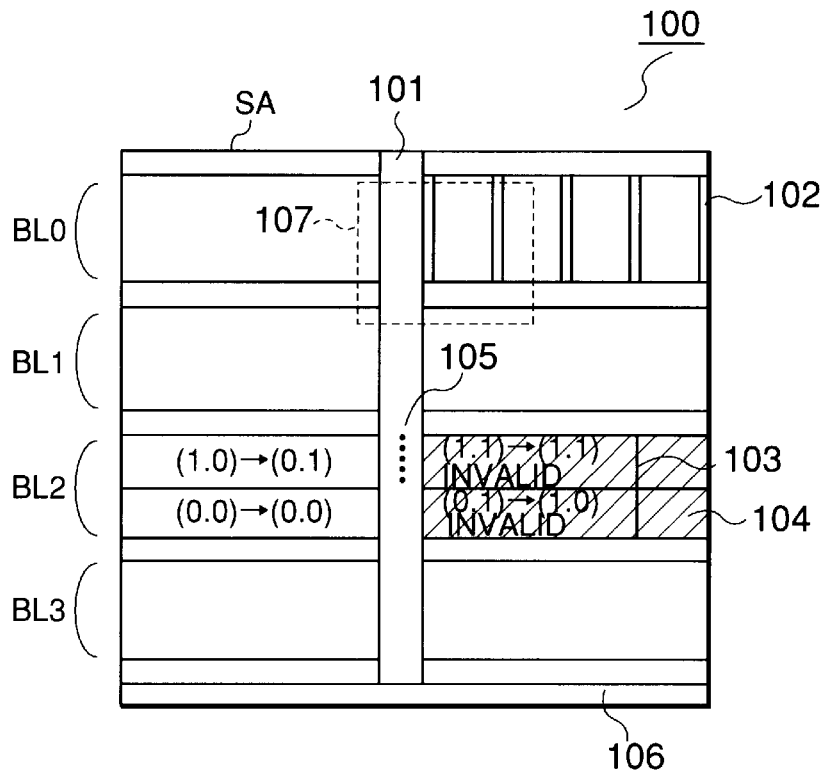
FIGS. 1 and 2 show a basic concept of the present invention.

FIG. 1 illustrates a semiconductor memory device 100 having memory capacity of, for example, 1G bits. The semiconductor memory device 100 is a DRAM of a double word line system composed of a main word line and sub-word lines. The main word line is selected by a main word decoder 101 which receives a portion of a row address and the sub-word line is selected by a sub-word decoder 102 which receives the remaining portion of the row address. A reference numeral 106 depicts a column decoder.

The semiconductor memory device 100 shown in FIG. 1 is divided to 4 memory blocks in view of simplicity of illustration. However, the semiconductor memory device 100 may be divided to 16 memory blocks or 32 memory blocks.

FIG. 1 shows a case where a bit line 103 contained in a memory block BL2 which is a third memory block from the top is defective. As will become clear from the following description, in the present invention, the whole memory block BL2 to which the defective bit line 103 belongs is not invalidated and only a half of the memory block BL2, which is shown by hatching, is invalidated and the other half is treated as being valid. In FIG. 1, when a right side bit line of a memory block, for example, memory block BL2, is defective, only a right side portion of the memory block BL2 is treated as being invalid and the left side portion of the same memory block is treated as being valid. FIG. 2 shows a case where a left side bit line is defective, in which case, only the left side portion 204 of the memory block is treated as being invalid and the right side portion thereof is treated as being valid.

Figure 2:
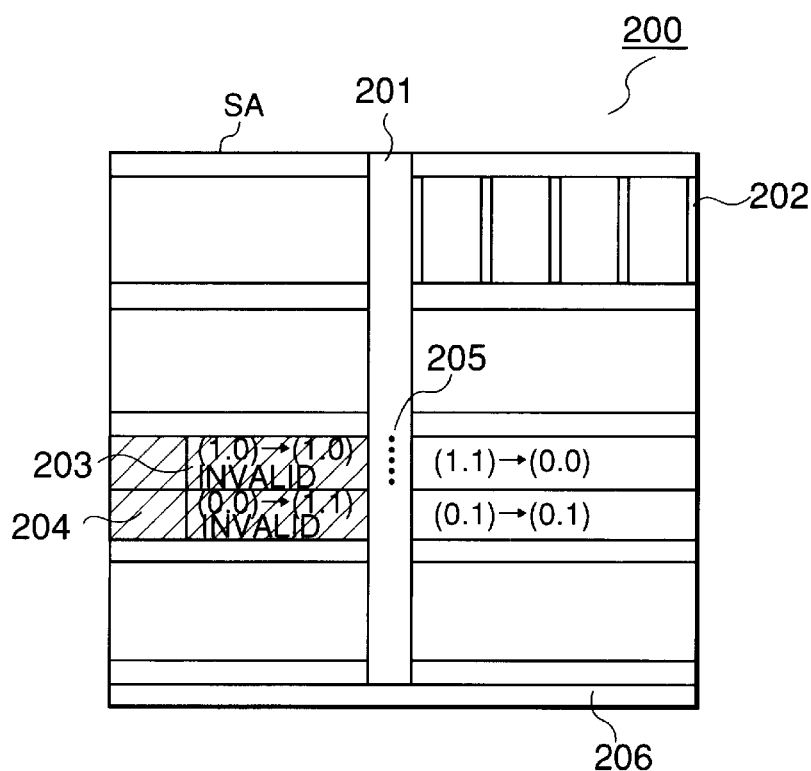

Although not shown in FIGS. 1 and 2, when there is a defective memory cell, a memory cluster to which the defective memory cell belongs is invalidated.

Now, the semiconductor memory device according to the first embodiment of the present invention will be described in more detail.

Figure 3:
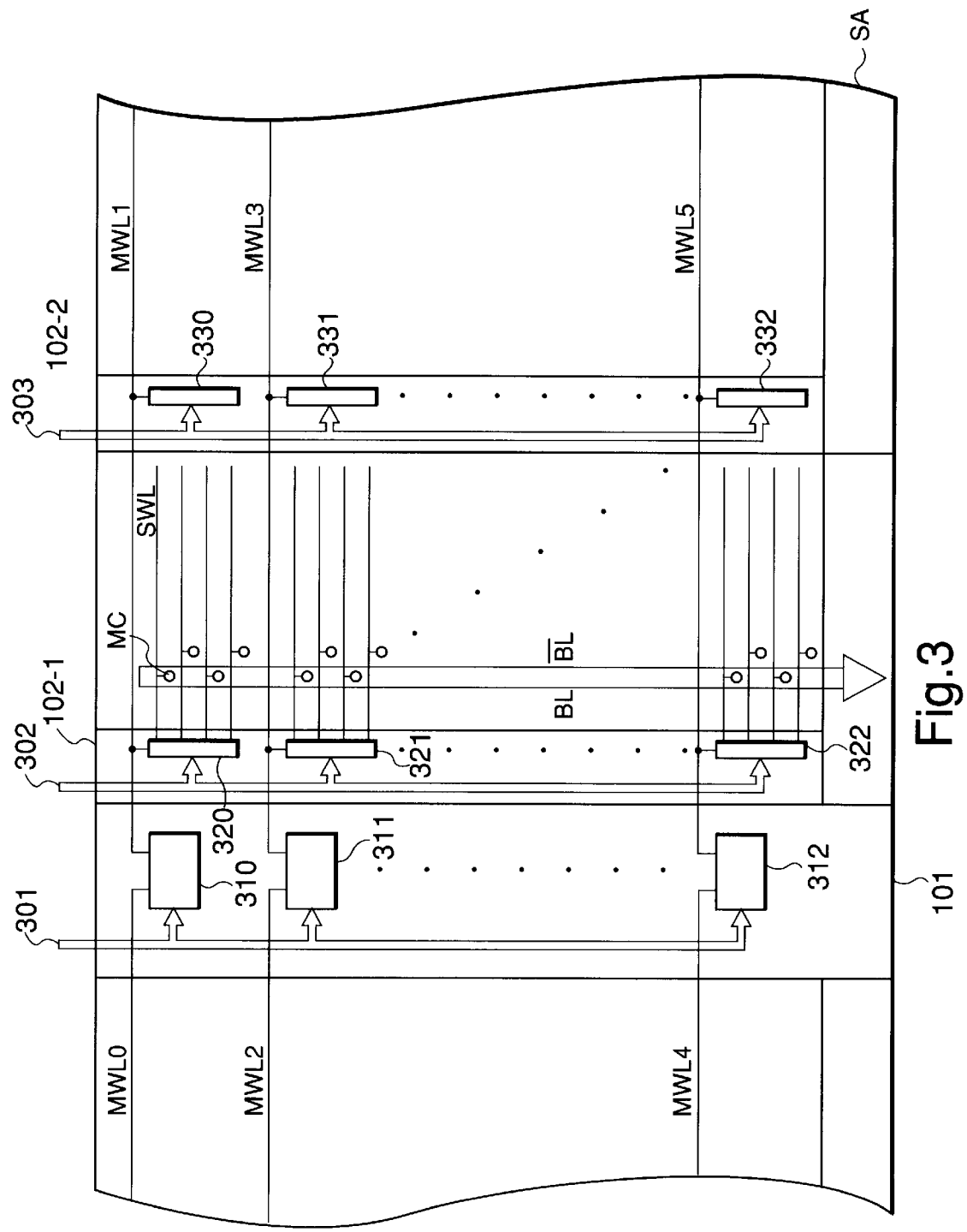
FIG. 3 shows a portion 107 shown in FIG. 1.

FIG. 3 shows a portion 107 of the semiconductor memory device 100 shown in FIG. 1 in an enlarged scale. As shown in FIG. 3, an address signal 301 which is a portion of a row address is supplied to the main word decoder 101. The address signal 101 is commonly supplied to a plurality of main word line drive circuits 310, 311 and 312 of the main word decoder and one of the main word line drive circuits is selected. The selected main word line drive circuit activates a corresponding main word line MWL. For example, when the address signal 301 selects the main word line drive circuit 310, the selected main word line drive circuit 310 activates main word lines MWL0 and MWL1. The respective main word lines may be composed of complementary main word line pairs MWL and MWLB. However, in view of the simplicity of illustration, all of the inverse main word lines MWLB are omitted in FIG. 3.

Address signals 302 and 303 which are other portions of the row address are supplied to the respective sub-word decoders 102-1 and 102-2, respectively. These address signals 302 and 303 are supplied commonly to sub-word line drive circuits 320 to 322 and 330 to 332 of the corresponding sub-word decoder, respectively. The respective sub-word line drive circuits are activated by the corresponding main word lines MWL. For example, the sub-word line drive circuit 320 is activated by the main word line MWL0. The activated sub-word line drive circuits responds to the address signals 302 and 303 to activate one of the corresponding sub-word line SWL, respectively. It should be noted that the address signals 302 and 303 are pre-decoded by a pre-decoder circuit which is not shown.

A memory cell MC is provided at each of cross points of the sub-word lines SWL and the paired bit lines BL and BL.

In the following description, all of address regions belonging to one main word line drive circuit are referred to as one memory cluster and all of address regions belonging to a plurality of main word line drive circuits corresponding to one bit line pair (in FIG. 3, the main word line drive circuits 310 to 312) are referred to as one memory block. That is, the memory clusters correspond to the main word line drive circuits, respectively, and, therefore, they are specified by upper bits of the row address. For example, the 1G bits DRAM is divided to, for example, 32 memory blocks each containing 64 memory clusters. In such case, one memory block corresponds to 64 main word line drive circuits.

Figure 9:
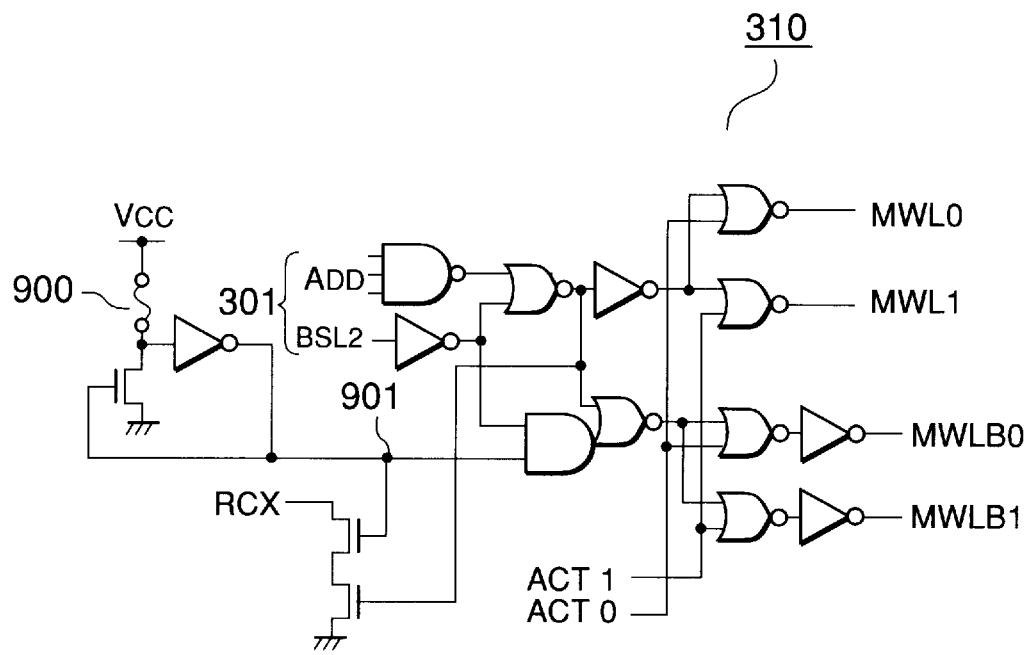
FIG. 9 is a circuit diagram showing a main word line drive circuit used in the semiconductor memory device according to the first embodiment of the present invention.

A circuit construction of, for example, the main word line drive circuit 310 will be described in detail with reference to FIG. 9. As shown in FIG. 9, the main word line drive circuit 310 receives the address signal 301 composed of an address signal ADD and a block selection signal BSL and, when the address signal 301 becomes a selection state, the main word lines MWL0 and MWL1 become high level and the inverse main word lines MWLB0 and MWLB1 become low level. In a non-selection state of the address signal 301, the main word lines MWL0 and MWL1 become low level and the inverse main word lines MWLB0 and MWLB1 become high level. The main word line MWL0 and the inverse main word line MWLB0 extend on a left side of a block and the main word line MWL1 and the inverse main word line MWLB1 extend on a right side of the block. The main word lines MWL0 and MWL1 are always in the same logic level and the inverse main word lines MWLB0 and MWLB1 are always in the same logic level unless an ACT0 signal or an ACT1 signal becomes high level. The ACT signals will be described later.

The main word line drive circuit further includes a fuse 900. The fuse 900 is cut when the corresponding cluster includes a defectiveness. The cutting of the fuse 900 may be achieved in various ways. For example, the fuse 900 may be cut by a laser beam or by flowing a large current therethrough on the basis of a result of test performed during the fabrication of the semiconductor memory device. The fuse 900 may be of polysilicon, etc.

In a state where the fuse 900 is not cut, that is, there is no defectiveness in the cluster, a point 901 is held in low level. On the other hand, when the fuse 900 is cut, that is, there is a defectiveness in the cluster, the point 901 is held in high level. Therefore, it is possible to read out the state of the fuse 900, that is, whether or not there is a defectiveness in the cluster, by a roll call test performed externally of the semiconductor memory device 100. In the roll call test mode, a roll call signal RCX from an invalid cluster is turned to low level and, therefore, it is possible to specify invalid clusters by detecting the state of the roll call signals RCX from the clusters.

Figure 10:
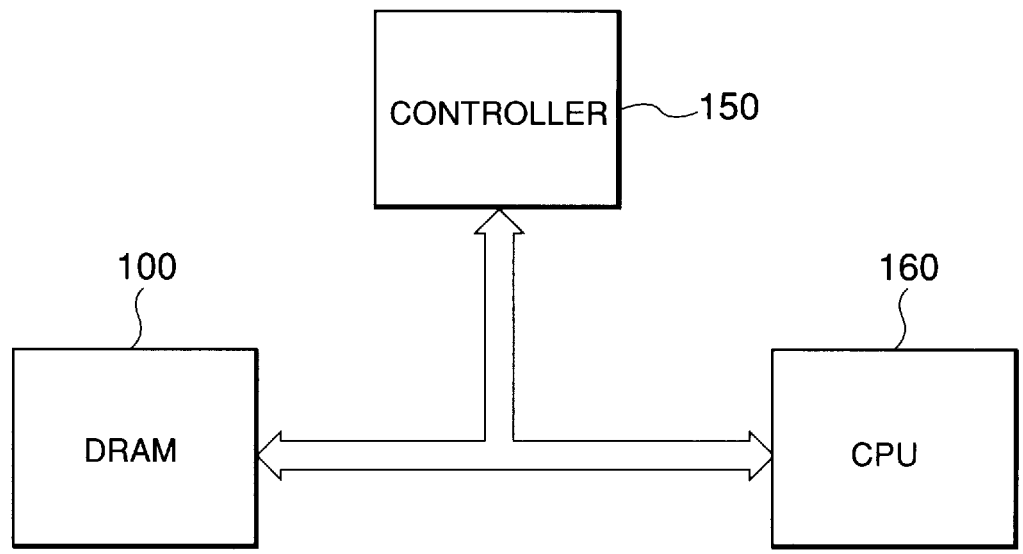
FIG. 10 is a block diagram showing a connection between the semiconductor memory device of the present invention and external circuits.
Figure 11:
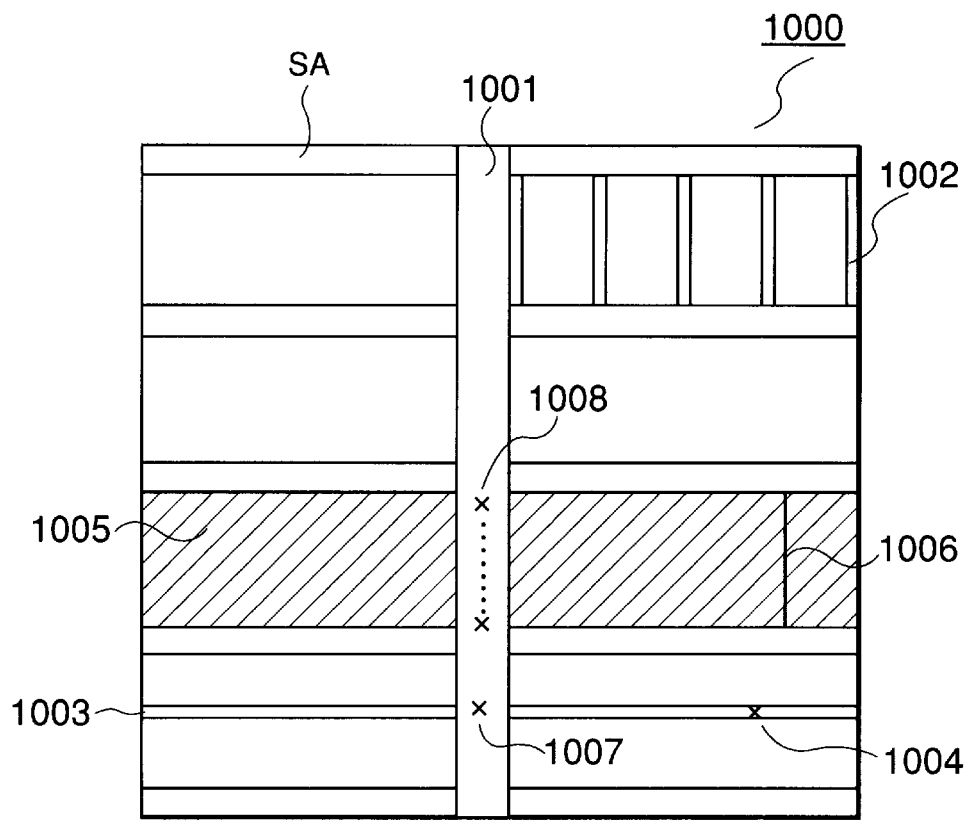
FIG. 11 shows a conventional semiconductor memory device.
Figure 12:
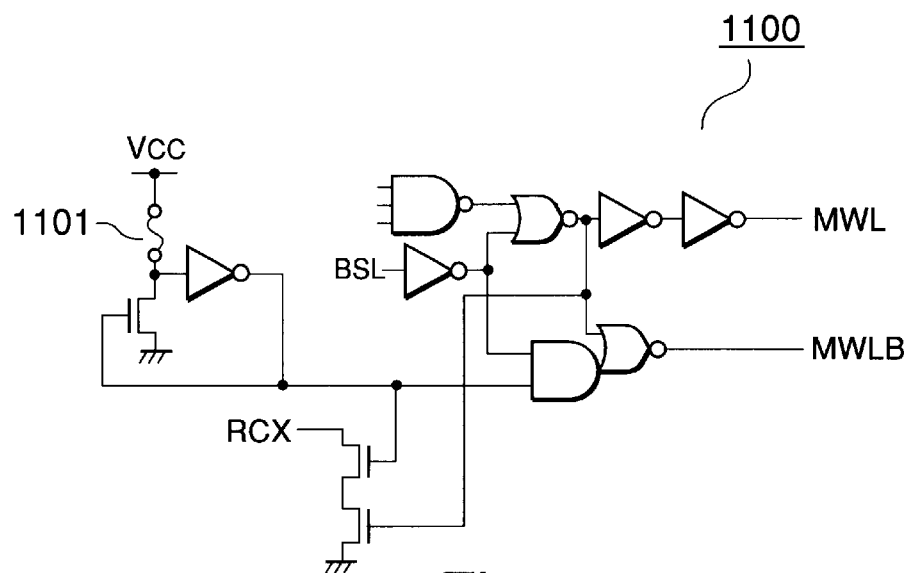
FIG. 12 is a circuit diagram showing a main word line drive circuit used in the conventional semiconductor memory device.

The roll call test is performed by a controller 150 shown in FIG. 10. A user of a semiconductor memory device 100 performs a roll call test by the controller 150 immediately after a power source is connected to the semiconductor memory device and checks roll call signals RCX of the respective clusters thereof sequentially. When it is detected by the roll call test that a certain cluster becomes invalid, the controller 150 registers the cluster in a defective address table as defective address. When a data storage request requesting a data storage in the semiconductor memory device 100 is received from a CPU 160 through the controller 150, the controller 150 manages the semiconductor memory device 100 such that the defective address thereof is not used.

Therefore, a portion of the memory capacity of the semiconductor memory device 100 is practically lost due to the presence of the defective cluster which can not be used. However, since the semiconductor memory device including defectiveness which can not be salvaged by the redundancy mechanism can be shipped as an acceptable memory device, the yield of the semiconductor memory is improved.

The method for treating only a half of a block which includes defective bit line as being invalid and the remaining half of the block which has no defectiveness as being valid will be described.

Returning to FIG. 1, particularly, to a row address of the block BL2 a half of which becomes invalid, the row address of the right side region 104 which becomes invalid and the row address of the left side portion which becomes valid are the same. That is, the right side portion and the left side portion of the block are distinguished by not the row address but only the column address. However, since the decision of a region to be invalidated is managed for every cluster, that is, by only the row address and has no relation to the column address, as mentioned previously, it is impossible to make one side portion of the block invalid and the other side portion of the block valid. On the other hand, it may be considered to manage a region to be invalidated not every cluster but, for example, every sector using both the row address and the column address. However, such consideration is not practical since the management of the semiconductor memory 100 by the controller 150 becomes complicated.

In the present invention, when there is a defective bit line, a right and left side portions of a block are made possible to be specified by converting the uppermost bits of the row address and the column address. Incidentally, right side logic values in the right and left portions in the block BL2 in FIG. 1 are the uppermost bits of the row address and the column address before conversion and left side logic values in the right and right portions in the same block are the uppermost bits of these addresses after conversion.

A circuit construction of an address converter circuit 400 for converting the uppermost bits of the row and column addresses and a connection thereof to other circuits will be described with reference to FIGS. 4, 6 and 7.

Figure 4:
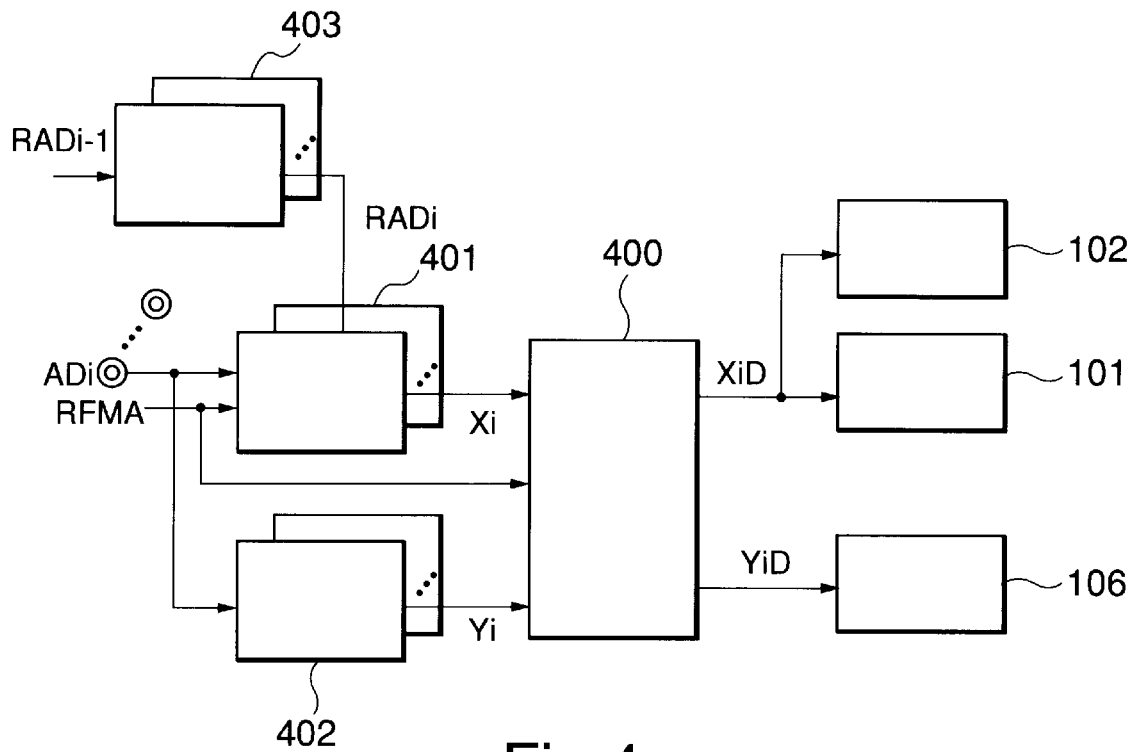
FIG. 4 is a block diagram showing a circuit related to an address signal.

In FIG. 4, reference numerals 401 and 402 show a row address buffer and a column address buffer, respectively. The uppermost bit Xi of the row address and the uppermost bit Yi of the column address which are output from the row address buffer 401 and the column address buffer 402 are supplied to the address converter circuit 400. These address signals converted by the address converter circuit 400 are supplied to the aforementioned main word decoder 101, the sub-word decoder 102 and the column decoder 106. A refresh signal RFMA is further supplied to the address converter circuit 400. The refresh signal RFMA will be described later.

Figure 6:
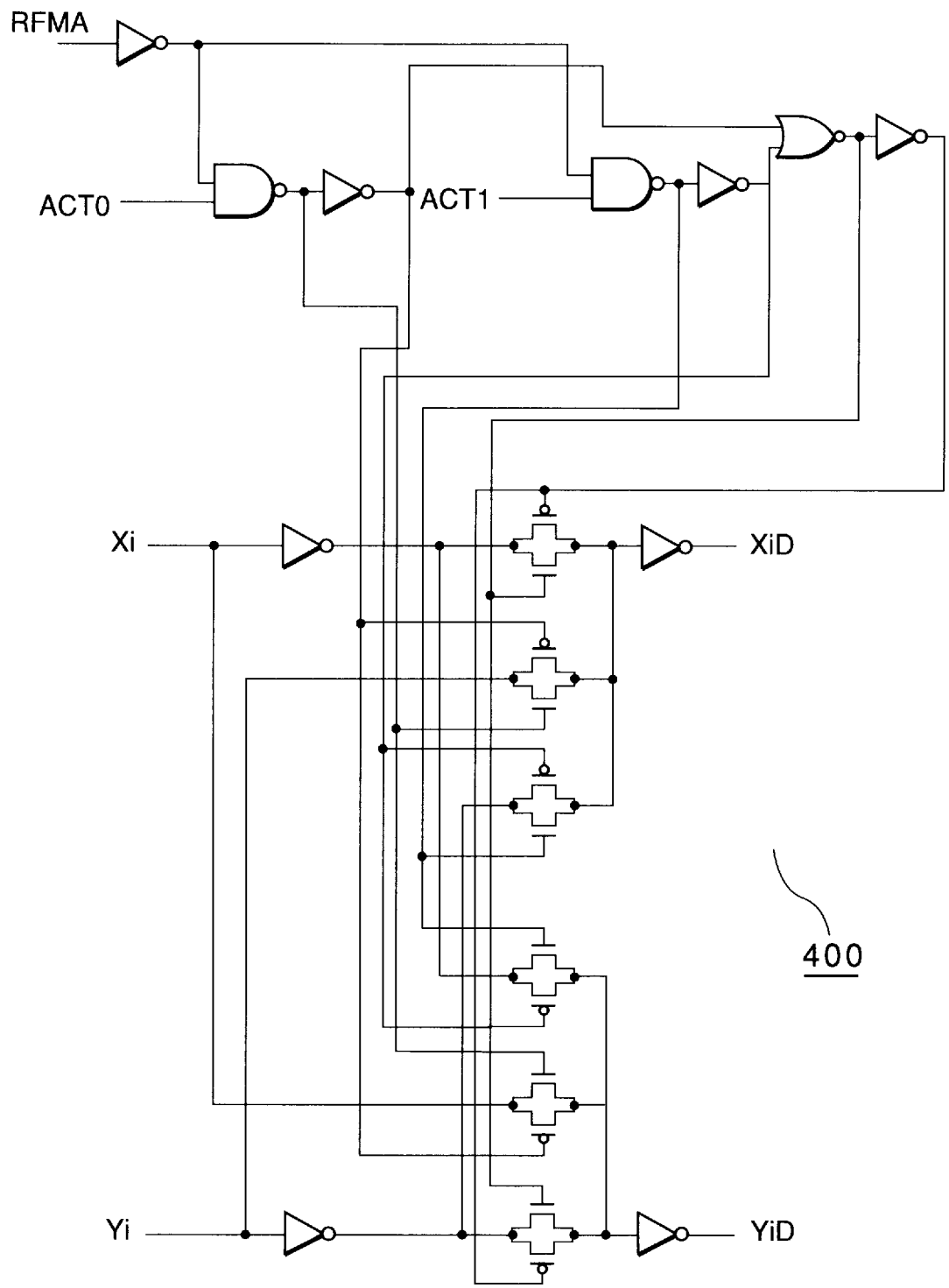
FIG. 6 is a circuit diagram showing an address converter circuit used in the semiconductor memory according to a first embodiment of the present invention.
Figure 7:
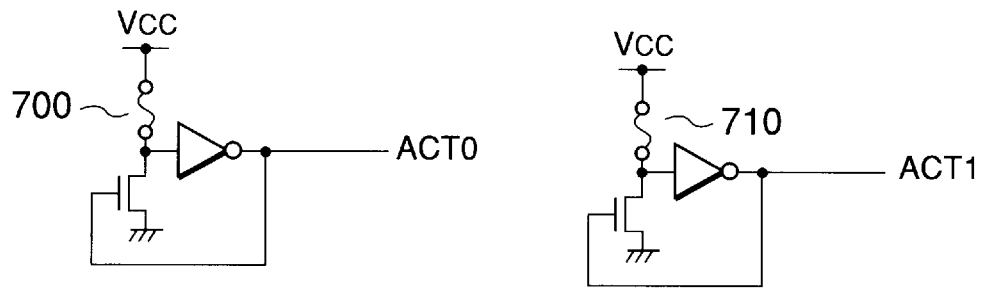
FIGS. 7 and 8 are circuit diagrams showing ACT signal generator circuits contained in the address converter circuit.

FIG. 6 shows a circuit construction of the address converter circuit 400 which controls the conversions of the uppermost bits of the row address and the uppermost bits of the column address. The signals ACT0 and ACT1 shown in FIG. 6 indicate positions of defective bit lines and is generated by a circuit shown in FIG. 7 which is included in the address converter circuit 400. Referring to FIG. 7, the signal ACT0 indicating the defective bit line in the left side portion of the block is made high level when a fuse 700 is cut and the signal ACT1 indicating the defective bit line in the right side portion of the block is made high level when a fuse 710 thereof is cut.

As shown in FIG. 9, when the signals ACT0 and ACT1 are low level, the main word lines extending on the left and right side portions are in the same logic level. However, one of the signals ACT0 and ACT1 becomes high level, the one main word line is fixed to a non-active state regardless of the address signal. That is, as mentioned above, when the fuse 700 is cut and the signal ACT0 becomes high level, the main word line MWL0 is fixed to the non-active state. On the other hand, when the signal ACT1 becomes high level, the main word line MEL1 is fixed to the non-active state.

Now, the address converting operation will be described.

Figure 14:
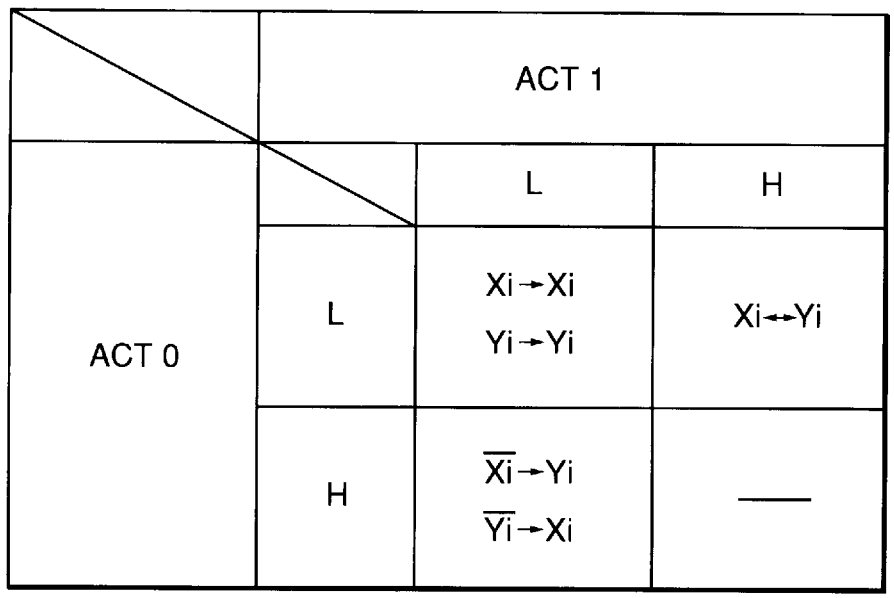
FIG. 14 is a table showing a conversion performed by an address converter circuit.

Returning to FIG. 6, when the refresh signal RFMA is in low level, that is, when the operation is not in a refresh mode, the conversion shown in FIG. 14 is performed according to the logic levels of the signals ACT0 and ACT1. That is, when both of the signals ACT0 and ACT1 are in low level, that is, when there is no defective bit line, the conversion is not performed (Xi→Xi, Yi→Yi). When the signal ACT0 is high level, that is, when there is a defective bit line on the left side portion of any block, Xi is inverted to Yi and Yi is inverted to Xi (Xi→Yi, Yi→Xi). On the other hand, when the signal ACT1 is high level, that is, when there is a defective bit line on the right side portion of any block, Xi and Yi are exchanged (Xi←→Yi). A case where there is a defective bit line on the right side portion of a block and there is also a defective bit line on the left side portion of the same block will be described later.

The technical reason for such conversion will be described by referring again to FIG. 1. Since FIG. 1 shows the case where there is a defective bit line on the right side portion of the block, the signal ACT1 is high level. Therefore, the uppermost bit Xi of the row address and the uppermost bit Yi of the column address are exchanged, so that the uppermost bits (1,1) and (0,1) of the respective addresses in the defective region 104 are converted into (1,1) and (1,0), respectively. With this conversion, the uppermost bits (1,0) and (0,0) of the left side region which does not include defective bit are converted into (0,1) and (0,0), respectively.

Figure 5:
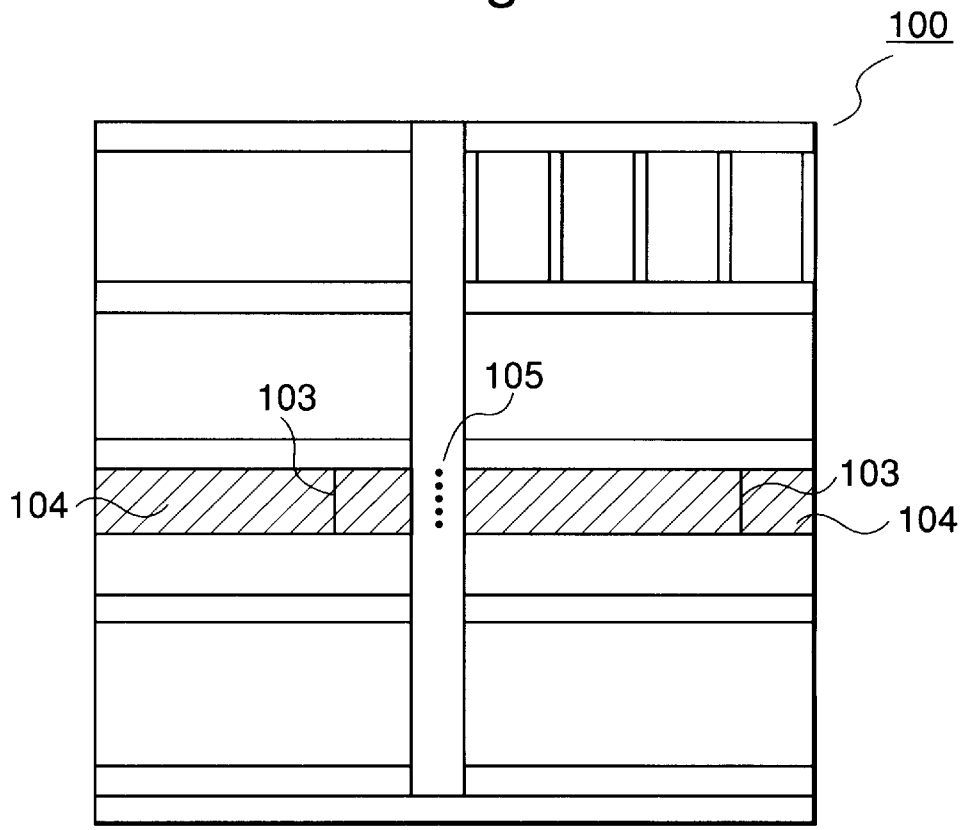
FIG. 5 shows a layout of a semiconductor memory device whose address is converted.

As a result, the address of the portion corresponding to (0,1) in the defective region 104 and the address of the portion corresponding to (1,0) in the non-defective region are exchanged. That is, the address of the portion corresponding to the defective region is equivalently changed as shown in FIG. 5. Therefore, the cluster which is invalidated in this block BL2 becomes only an upper half cluster and the lower half cluster can be effectively used. In other words, it is possible to cut only a fuse 105 in the main word line drive circuit corresponding to the upper half cluster of the block BL2 while maintaining a fuse in the main word line drive circuit corresponding to the lower half cluster uncut. Therefore, assuming that one block includes, for example, 64 clusters, the number of clusters which become invalid becomes only 32. Since it is possible to reduce the number of clusters which become invalid, it is possible to restrict the reduction of memory capacity of the semiconductor memory.

Similarly, a case where there the left side portion of on the left side portion of a block as shown in FIG. 2 will be considered. In such case, the signal ACT0 is high level. Therefore, the uppermost bit Xi of the row address is inverted to Yi and the uppermost bit Yi of the column address is inverted to Xi. Thus, the uppermost bits (1,0) and (0,0) of a defective region 204 are converted into (1,0) and (1,1), respectively. Therefore, the uppermost bits (1,1) and (0,1) of the left side region which contains no defective bit are converted into (0,0) and (0,1), respectively.

As a result of this conversion, the address of the portion corresponding to (0,0) in the defective region 204 in the block BL2 containing a defective bit line 203 and the address of the portion corresponding to (1,1) in the defective region 204 in the block BL2 containing no defective bit line are exchanged. That is, the cluster which is invalidated in this block BL2 becomes only an upper half cluster and the lower half cluster can be effectively used. According to this embodiment, it is possible to reduce the number of clusters which are to be invalid to a half of the conventional case by this address signal conversion.

However, in this embodiment, if the refresh operation is performed after the address signal conversion, two word lines are activated for one bit line, causing data to be destroyed. In this embodiment, in order to prevent the address conversion from being performed during the refresh operation, the refresh signal RFMA is supplied to the address conversion circuit 400 as shown in FIGS. 4 and 6. The address conversion circuit 400 inhibits the address conversion regardless of the level of the signal ACT, when the refresh signal RFMA becomes high level. Therefore, the address conversion is not performed during the refresh operation and thus the destruction of data is prevented.

However, when defective bit lines exist in both the right and left portions in one block, the address conversion itself becomes meaningless and, therefore, the fuses 700 and 710 are not cut. In such situation, fuses of all of the main word line drive circuits in that block are cut so that all clusters belonging to that block become invalid.

As mentioned, this embodiment has an advantage that the number of clusters which are made invalid becomes a half of that of the conventional semiconductor memory, even if the defective bit line exists. However, when, in a certain block, a defective bit line exists in, for example, the right side portion thereof and, in another block, a defective bit line exists in the left side portion, it is impossible to reduce the number of clusters which are made invalid to a half of that of the conventional semiconductor memory, because the address conversion method for the case where the defective bit line exists in the right side portion of a block is different from that for the case where the defective bit line exists in the left side portion of the block, as mentioned above. Therefore, in such case, for the certain block, the number of clusters of the certain block which are made invalid is reduced to a half of that of the conventional semiconductor memory by the address conversion according to this embodiment and all clusters of the another block are to be made invalid by cutting all of the fuses of the main word line drive circuits included in the another block. Even in this case, the number of clusters which are made invalid is reduced to ¾ of the conventional semiconductor memory.

A second embodiment of the present invention improves the semiconductor memory according to the first embodiment. According to the second embodiment, the number of clusters which are to be made invalid is always a half of that of the conventional semiconductor memory even in the case where, in a certain block, a defective bit line exists in, for example, the right side portion thereof and, in another block, a defective bit line exists in the left side portion.

A semiconductor memory according to the second embodiment includes an improved address converter circuit 400. That is, the semiconductor memory of this embodiment is featured by that a signal ACT is supplied to every block. This will be described in detail with reference to FIGS. 8 and 13.

Figure 8:
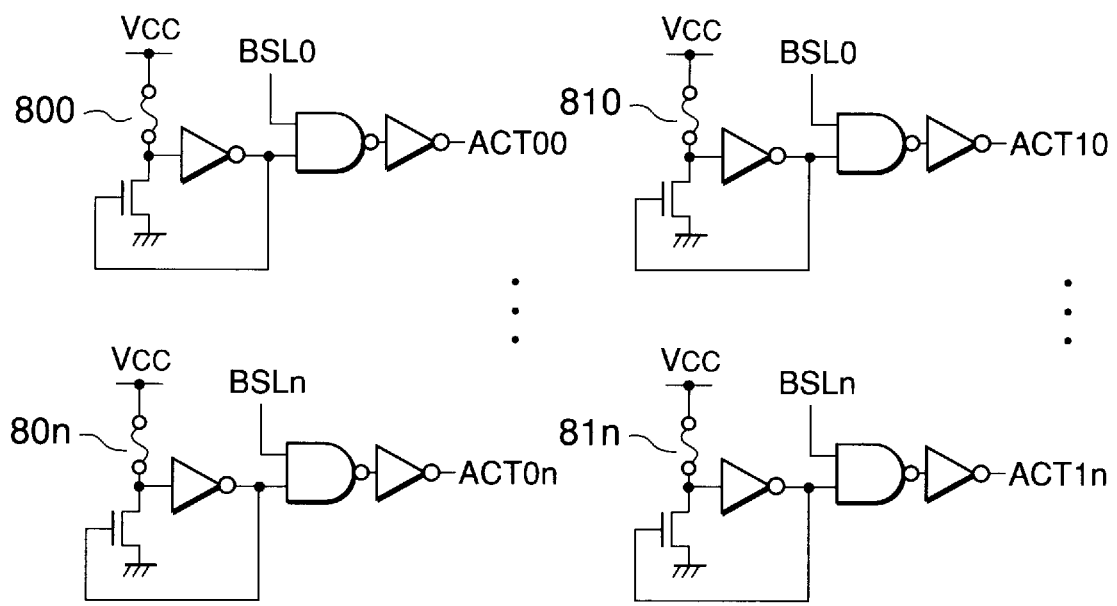

FIG. 8 shows ACT signal generator circuits in the semiconductor memory according to the second embodiment of the present invention. The signals ACT generated by these circuits indicate right or left side portions of the respective blocks which include defective bit lines. For example, the signal ACT00 indicates that a defective bit line exists in a left side portion of the block BL0 and the signal ACT10 indicates that a defective bit line exists in a right side portion of the block BL0. Similarly, the signal ACT01 indicates that a defective bit line exists in a left side portion of the block BL1. The ACT signal generator circuits are supplied with block selection signals BSL respectively as shown in FIG. 8 and only those of the signals ACT which correspond to blocks selected are used as having information. The signals ACT corresponding to blocks which are not selected are fixed to low level regardless of existence or absence of defective bit line.

Figure 13:
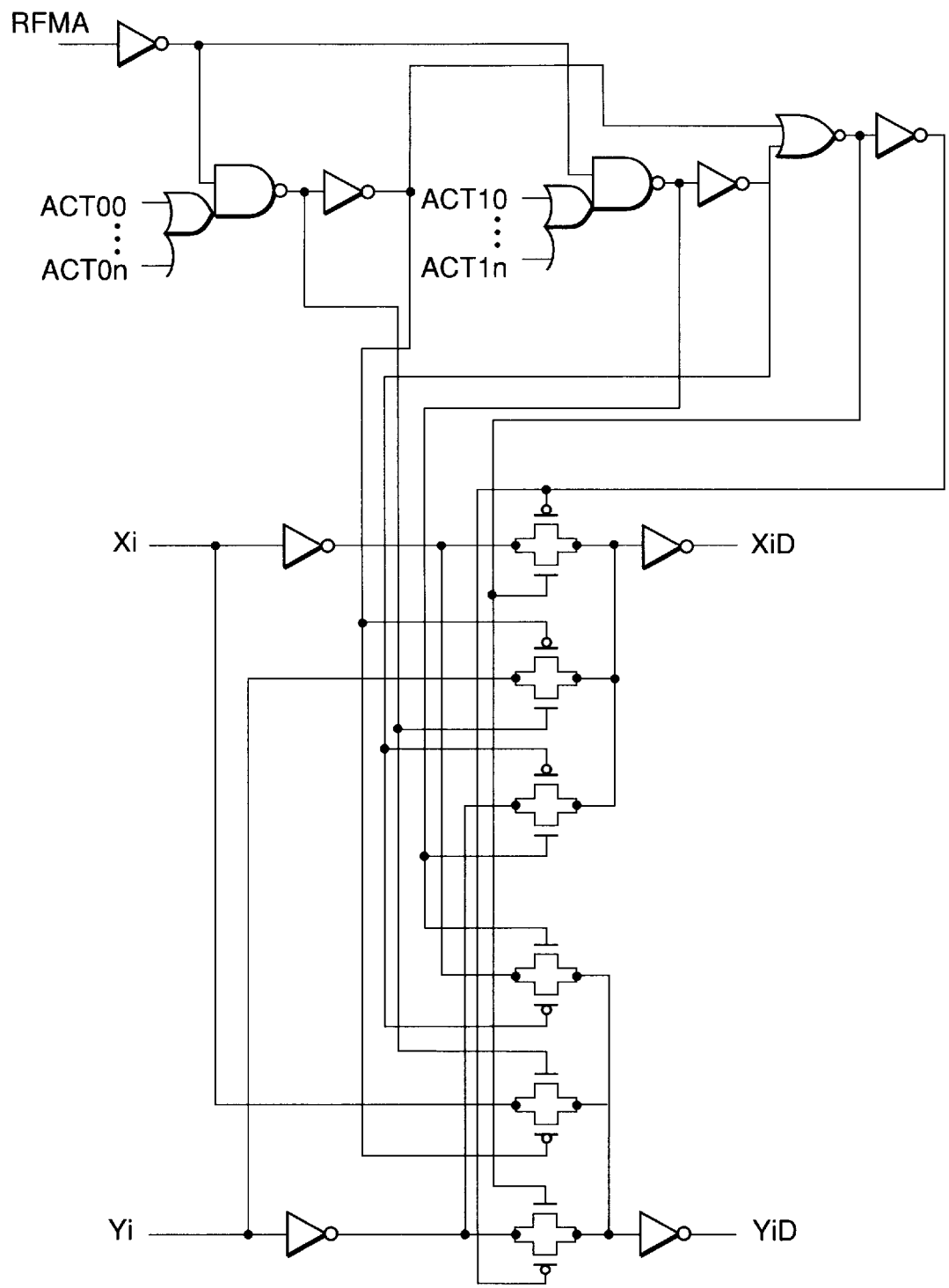
FIG. 13 is a circuit diagram showing an address converter circuit used in a semiconductor memory device according to a second embodiment of the present invention.

As shown in FIG. 13, the signals ACT00 to ACT0n which indicate the defective bit lines in the right side portions of the respective blocks are ORed and the signals ACT10 to ln which indicate the defective bit lines in the left side portions of the respective blocks are also ORed. Therefore, the address conversion circuit 400 can sequentially change the conversion method correspondingly to the signals ACT of a block which is being accessed. Since it is possible to determine existence or absence of address conversion and conversion method thereof every block in this manner, the number of clusters which become invalid becomes a half in the case of the conventional semiconductor memory even in a case where, in a certain block, a defective bit line exists in, for example, the right side portion thereof and, in another block, a defective bit line exists in the left side portion. However, when there are defective bit lines in right and left side portions in the same block, all clusters contained in that block are made invalid as in the first embodiment.

Figure 15:
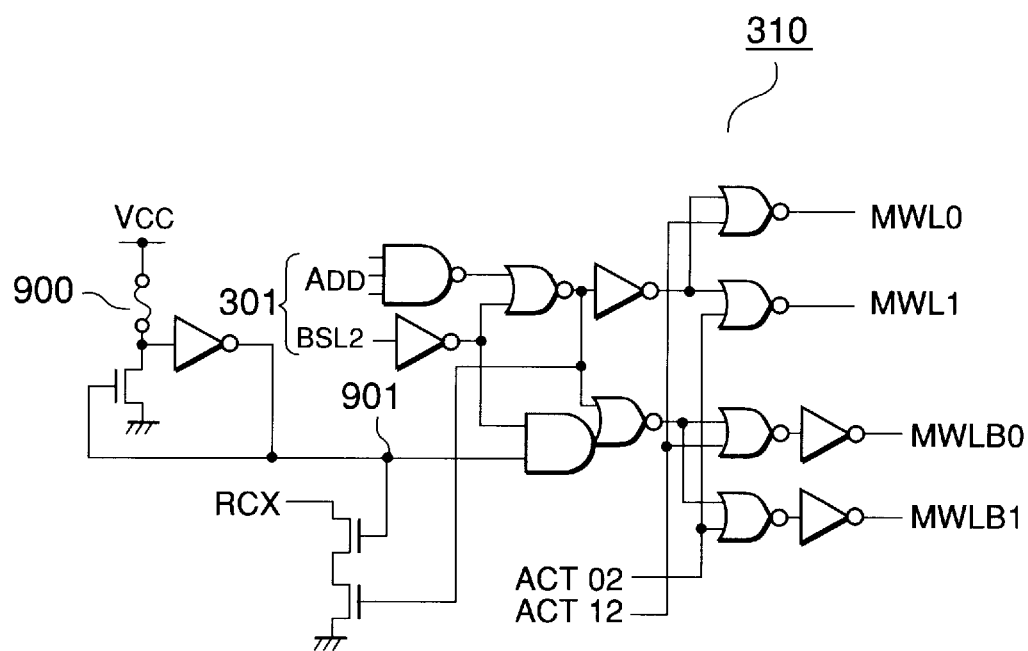
FIG. 15 is a circuit diagram showing a main word line drive circuit used in the semiconductor memory device according to the second embodiment of the present invention.

The signals ACT generated for the respective blocks are supplied to the respective main word line drive circuits 310 each shown in FIG. 15.

As described hereinbefore, according to the present invention, a semiconductor memory device having a minimum number of memory cells to be separated due to existence of defective bit line.

What is claimed is:

1. A semiconductor memory device comprising a main word line, a first and second memory regions each of which is activated by said main word line, a first circuit for activating a first signal indicative of a defect of at least one of said first and second memory regions, a second circuit for activating a second signal indicative of a defect of said first memory region, a third circuit for activating a third signal indicative of defect of said second memory region, and a fourth circuit for invalidating said first memory region when each of said first and second signals is activated and invalidating said second memory region when each of said first and third signals is activated.

2. The semiconductor memory device as claimed in claim 1, further comprising an address converter circuit converting each of at least a part of a row address and at least a part of a column address when at least one of said first and second memory region is invalidated.

3. A semiconductor memory device comprising:

a first and a second memory portions, each of said first and second memory portions including a plurality of memory cells, said first and second memory portions being selected in response to a first and a second column addresses, respectively;

a first main word driver activating a first main word line in response to a first row address, said first main word line being elongated to each of said first and second memory portions;

a second main word driver activating a second main word line in response to a second row address, said second main word line being elongated to each of said first and second memory portions;

a control signal generator generating a control signal indicating an existence of a defect in at least said first and second memory portions; and an address converter circuit converting said first row address to said first colimn address and said second row address to said second colimn address in response to said control signal.

4. The semiconductor memory device as claimed in claim 3, wherein said address converter circuit being inactivated during a refresh cycle.

* * * * *

UNITED STATES PATENT AND TRADEMARK OFFICE
CERTIFICATE OF CORRECTION

PATENT NO. : 5,889,712
DATED : March 30, 1999
INVENTOR(S) : Tadahiko Sugibayashi It is certified that error appears in the above-identified patent and that said Letters Patent is hereby corrected as shown below:

Claim 3, Col. 10, line 28, "colimn" should be --column--

Claim 3, Col. 10, line 29, "colimn" should be --column--

Signed and Sealed this

Nineteenth Day of October, 1999

Attest:

Attesting Officer

Q. TODD DICKINSON

Acting Commissioner of Patents and Trademarks